United States Patent
Martin et al.

(10) Patent No.: US 6,762,534 B2
(45) Date of Patent: Jul. 13, 2004

(54) TRANSVERSALLY COUPLED RESONATOR FILTER

(75) Inventors: Günter Martin, Dresden (DE); Bert Wall, Potsdam (DE)

(73) Assignee: Tele Filter, Zweigniederlassung der Dover Germany GmbH, Teltow (DE)

( * ) Notice: Subject to any disclaimer, the term of this patent is extended or adjusted under 35 U.S.C. 154(b) by 170 days.

(21) Appl. No.: 10/203,308

(22) PCT Filed: Dec. 10, 2001

(86) PCT No.: PCT/DE01/04676

§ 371 (c)(1),
(2), (4) Date: Aug. 6, 2002

(87) PCT Pub. No.: WO02/49212

PCT Pub. Date: Jun. 20, 2002

(65) Prior Publication Data

US 2003/0011279 A1 Jan. 16, 2003

(30) Foreign Application Priority Data

Dec. 11, 2000 (DE) .......................... 100 62 847

(51) Int. Cl.$^7$ ................................ H01L 41/08

(52) U.S. Cl. ................ 310/313 B; 310/313 R; 333/193

(58) Field of Search ............ 310/313 B, 310.3, 310/13 D, 313 R, 193–196

(56) References Cited

U.S. PATENT DOCUMENTS

| | | | | |
|---|---|---|---|---|
| 4,494,031 A | * | 1/1985 | Barnes et al. | ............ 310/313 B |
| 5,115,216 A | * | 5/1992 | Hikita et al. | ................ 333/195 |
| 5,202,652 A | * | 4/1993 | Tabuchi et al. | ............. 333/193 |
| 5,682,126 A | * | 10/1997 | Plesski et al. | .............. 333/193 |
| 5,912,602 A | * | 6/1999 | Takagi et al. | ............... 333/193 |

FOREIGN PATENT DOCUMENTS

| | | |
|---|---|---|
| DE | 197 44 948 | 4/1999 |
| DE | 199 09 470 | 9/2000 |

OTHER PUBLICATIONS

M. Tanaka et al.: "Narrow Bandpass Filter using Double–Mode SAW Resonators on Quartz" (1984) Proceedings of the 38$^{th}$ Annual Frequency Control Symposium, pp. 286–293.
Martin G. et al.: "Waveguide Coupling of Saw Resonators With Different Properties" (1998) IEEE Ultrasonics Symposium Proceedings. Sendai, Miyagi, JP (1998) IEEE Ultrasonics Symposium (1998) pp. 39–42.

* cited by examiner

Primary Examiner—Mark Budd
(74) Attorney, Agent, or Firm—Collard & Roe, P.C.

(57) ABSTRACT

The invention relates to a transverse-mode-coupled resonator filter based on surface acoustic waves.

The object of the invention is to modify such resonator filters, in which there are disposed adjacent to one another on a substrate (1) a plurality of one-port resonator structures (2; 3), which comprise two strip reflectors (22 and 23; 32 and 33) and an interdigital transducer (21; 31) and together form a waveguide for surface acoustic waves, in such a way that the insertion loss of the filters is reduced, especially by reducing the damping due to the cascade connection.

This object is achieved by the fact that at least one of the one-port resonator structures (2; 3) differs from the other one-port resonator structures by the ratio of the finger width to the spacing (216) of the finger centers (214; 215) and by the ratio of the width of the reflector strips (221; 231; 321; 331) to the spacing (226; 236) of the centers (224; 225 and 234; 235) of the reflector strips (221; 231; 321; 331).

The invention is applicable in particular to bandpass filters with a relative bandwidth on the order of 0.1 percent and to resonators for oscillators.

15 Claims, 1 Drawing Sheet

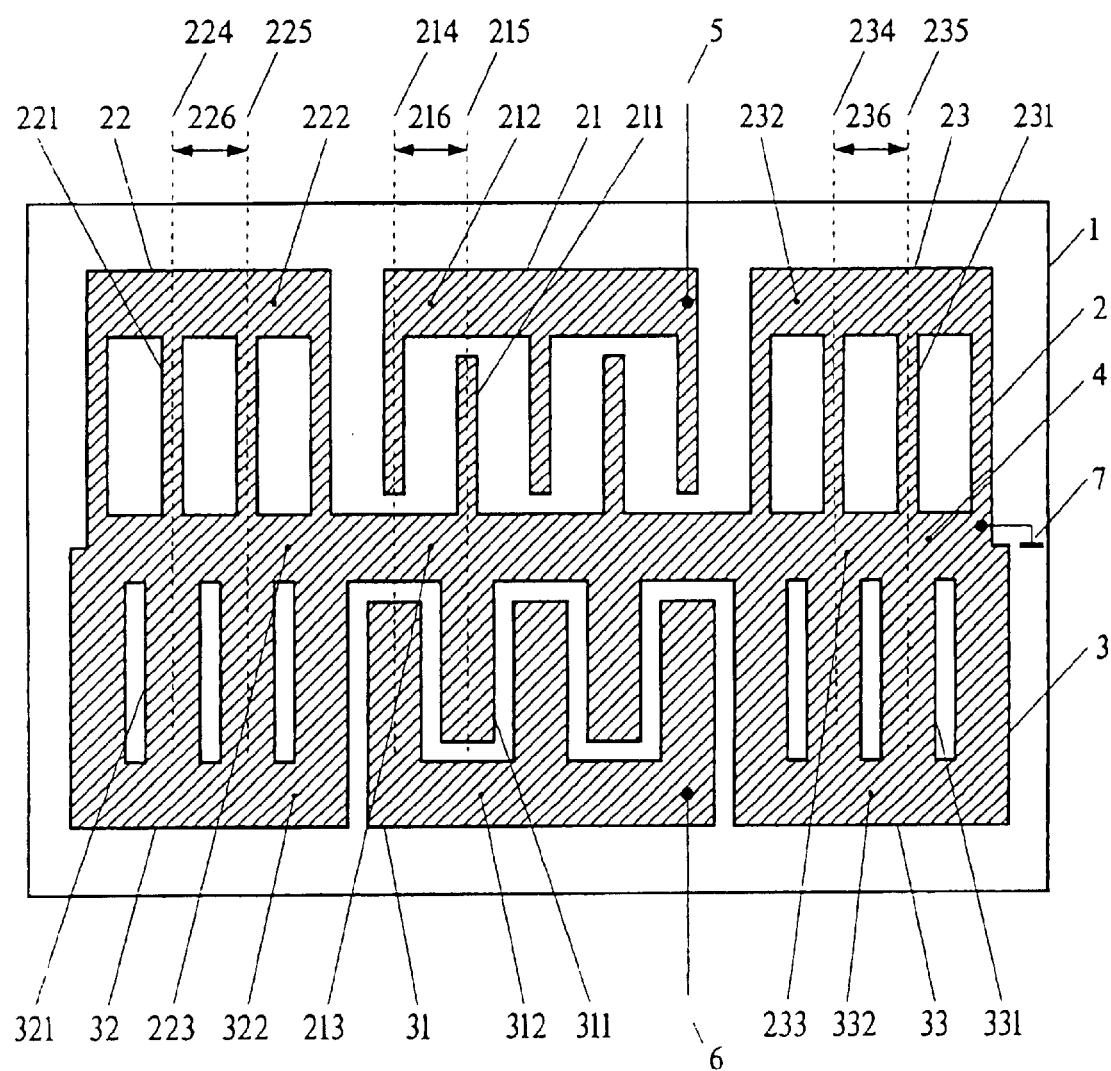

TRANSVERSALLY COUPLED RESONATOR FILTER

CROSS REFERENCE TO RELATED APPLICATIONS

Applicants claim priority under 35 U.S.C. §119 of German Application No. 100 62 847.8 filed Dec. 11, 2000. Applicant also claims priority under 35 U.S.C. S365 of PCT/DE01/04676 filed Dec. 10, 2001. The international application under PCT article 21(2) was not published in English.

TECHNICAL FIELD

The invention relates to the art of electrotechnology and electronics. Objects for which the invention may have practical application are components based on surface acoustic waves, such as bandpass filters with a relative bandwidth on the order of 0.1 per cent and resonators for oscillators.

PRIOR ART

Transverse-mode-coupled resonator filters are known in which there are disposed adjacent to one another on a piezoelectric substrate a plurality of one-port resonator structures, which comprise two strip reflectors and an interdigital transducer, wherein the strip reflectors enclose a plane cavity and their reflector strips are shorted by short-circuit strips, while the interdigital transducer is disposed in the plane cavity, the strip zones of the strip reflectors and the finger zones of the interdigital transducers in each one-port resonator structure forming, together with the short-circuit strips and with the collector electrodes respectively, waveguides for surface acoustic waves, and the one-port resonator structures being coupled with one another by virtue of the waveguide effect.

In a special embodiment (German Patent 19744948), two one-port resonator structures—referred to therein as waveguide tracks—are coupled via two further waveguide tracks, which do not contain any transducers. The otherwise homogeneously metallized outer collector electrodes are subdivided into strips of different widths extending toward the transducer fingers, and into gaps located therebetween. This subdivision ensures that phase velocities with values between that in the grating regions (waveguide tracks) and that in the free zone are established in the outer collector electrodes. Wave excitation does not take place in these zones. All transducer fingers and reflector strips have the same width. This is also true of the gaps between the transducer fingers and reflector strips.

The most widely used special embodiment comprises two one-port resonator structures (M. Tanaka, T. Morita, K. Ono and Y. Nakazawa, "Narrow bandpass filter using double-mode SAW resonators on quartz", 38th Annual Frequency Control Symposium 1984, pp. 286–293 [1]). The two transducers, which are operated as the filter input and output, have a common collector electrode, which is connected to ground potential. Usually two identical filters of this type are interconnected as a cascade.

The disadvantage of this embodiment is that the cascade connection leads to excessive damping, and so the insertion loss of the filter is too large.

EXPLANATION OF THE INVENTION

The object of the invention is to modify the known type of transverse-mode-coupled resonator filters based on surface acoustic waves such that the insertion loss of the filters is reduced, especially by reducing the damping due to the cascade connection.

This object is achieved according to the invention with the transverse-mode-coupled resonator filter described in the claims.

The inventive resonator filter is characterized in that at least one of the one-port resonator structures differs from the other one-port resonator structures by the ratio of the finger width to the spacing of the finger centers and by the ratio of the width of the reflector strips to the spacing of the centers of the reflector strips.

The velocity of propagation of surface acoustic waves depends on, among other factors, the ratio of the finger width to the spacing of the finger centers and of the width of the reflector strips to the spacing of the centers of the reflector strips, or in other words the metallization ratio. The presence of one-port resonator structures with different metallization ratios therefore means that the propagation velocities in the finger and strip gratings of different one-port resonator structures differ from one another. Accordingly, it is possible to design resonator filters which, in those one-port resonator structures whose transducers are coupling transducers, have a propagation velocity different from that in other one-port resonator structures. Transducers of different filters connected directly to one another are regarded as such coupling transducers. This is the case, for example, in a filter cascade, in which the output transducer of the first filter is connected to the input transducer of the second filter. When two identical filters are connected in cascade, elevated energy density can be generated in the vicinity of the low-frequency of high-frequency resonance in the coupling transducers. As a result, the real conductance of the coupling transducers is increased, whereas their capacitance remains unchanged. In this way the effective coupling coefficient is increased. This is the prerequisite for reduction of the insertion loss caused by the cascade connection. The higher effective coupling coefficient causes an increase in the resonance splitting of the low-frequency and high-frequency resonance resulting from the cascade connection.

The invention can be configured expediently as follows.

In an expedient embodiment, the transducers and strip reflectors of neighboring one-port resonator structures form common collector electrodes and short-circuit strips respectively.

Those one-port resonator structures which differ from the other one-port resonator structures by the ratio of the finger width to the spacing of the finger centers and of the width of the reflector strips to the spacing of the centers of the reflector strips can also differ from one another by the spacing of the finger centers and by the spacing of the centers of the reflector strips. Nevertheless, the spacing of the finger centers and the spacing of the centers of the reflector strips can also be the same in all one-port resonator structures.

The number of one-port resonator structures can be equal to two. At the same time, the apertures of the transducers and reflectors in the two one-port resonator structures can be the same or different.

In a particularly expedient embodiment, the number of one-port resonator structures is greater than two. Thereby there is achieved the possibility that the one-port resonator structures form two groups, wherein all transducers within one group are connected to one another in parallel, one group representing the input transducers and the respective other group representing the output transducers.

Occasionally it is advantageous for gaps filled with reflector strips maintained at the same potential to be present between neighboring one-port resonator structures.

The transducers in at least one of the one-port resonator structures can differ from the other transducers by the finger polarity.

In a particularly expedient embodiment, two identical filters form a filter cascade, in which the same group is used as the coupling transducer in both filters, the coupling transducer being regarded as that group which is connected to a group of the respective other filter. In an advantageous version, the group that forms the coupling transducer comprises one-port resonator structures with the same finger and reflector-strip width as well as the same gaps between them. The ratio of the finger width to the spacing of the finger centers and of the width of the reflector strips to the spacing of the centers of the reflector strips in the group forming the coupling transducer can be larger or smaller than in all other one-port resonator structures.

BRIEF DESCRIPTION OF THE DRAWING

The drawing shows in a basic diagram the design of an inventive transverse-mode-coupled resonator filter to be described in more detail in the following practical example.

BEST APPROACH TO OPERATION OF THE INVENTION

The invention will be explained in more detail hereinafter on the basis of a practical example and of the associated drawing.

Two one-port resonator structures 2 and 3 are disposed adjacent to one another on a piezoelectric substrate 1. They contain reflectors 22 and 23 and, in the same sequence, reflectors 32 and 33 respectively. Between reflectors 22 and 23 and between reflectors 32 and 33 respectively there are disposed interdigital transducers 21 and 31 respectively. Transducer 21 comprises collector electrodes 212 and 213 as well as fingers 211. Transducer 31 forms, together with transducer 21, common collector electrode 213, and it further comprises collector electrode 312 and fingers 311. Reflectors 22 and 23 are composed of reflector strips 221 and 231 respectively and of short-circuit strips 222 and 223 and of 232 and 233 respectively. Reflectors 32 and 33 form, together with reflectors 22 and 23 respectively, common short-circuit strips 223 and 233 respectively, and they are further composed of reflector strips 321 and 331 respectively and of short-circuit strips 322 and 332 respectively.

The centerlines of fingers 211 of transducer 21 and those of fingers 311 of transducer 31 represent continuations of one another and form common centerline 215. This is also true analogously for common centerline 214. Accordingly, spacing 216 of common centerlines 214 and 215 is the same in the two transducers 21 and 31. Nevertheless, fingers 211 and 311 of transducers 21 and 31 respectively have different widths.

The centerlines of reflector strips 221 of strip reflector 22 and those of reflector strips 321 of strip reflector 32 represent continuations of one another and form common centerline 224. This is also true analogously for common centerline 225. Accordingly, spacing 226 of common centerlines 224 and 225 are the same in the two reflector strips 22 and 32. Nevertheless, reflector strips 221 and 321 of strip reflectors 22 and 32 respectively have different widths. This description is also applicable analogously for strip reflectors 23 and 33, as follows.

The centerlines of reflector strips 231 of strip reflector 23 and those of reflector strips 331 of strip reflector 33 represent continuations of one another and form common centerline 235. This is also true analogously for common centerline 234. Accordingly, spacing 236 of common centerlines 234 and 235 is the same in the two strip reflectors 23 and 33. Nevertheless, reflector strips 231 and 331 of strip reflectors 23 and 33 respectively have different widths.

Short-circuit strips 222 and 232, 223 and 233 as well as 322 and 332 of the strip reflectors represent, in the same sequence, the extension of collector electrodes 212, 213 and 312. Short-circuit strips 223 and 233 form, together with collector electrode 213, coupling strips 4. Each one-port resonator structure is a waveguide for surface acoustic waves, thus guiding the waves in the zone of the fingers and reflector strips. Coupling strip 4 influences the coupling between the two waveguides.

Transducer 21 is connected to filter input 5. Transducer 31 is connected to filter input 6. Reflectors 22, 23, 32 and 33 as well as common collector electrode 213 are connected to ground potential 7.

By virtue of the broader fingers and reflector strips in one-port resonator structure 3, the propagation velocity in the finger and strip grating is smaller there than in one-port resonator structure 2, and so the profiles of the waveguide modes become asymmetric in such a way that the density of the wave energy and thus also the effective coupling coefficient becomes particularly large in the vicinity of the low-frequency resonance in one-port resonator structure 3. From two resonator filters, one of which is illustrated in the drawing, there can be formed a filter cascade by connecting terminal 6 of the first filter, or in other words the output thereof, to terminal 6 of the second filter, or in other words the input thereof. In both resonator filters, transducer 31 is the coupling transducer. By virtue of the increased effective coupling coefficient in the coupling transducers, the damping of the low-frequency resonance caused by the cascade connection is reduced.

What is claimed is:

1. A transverse-mode-coupled resonator filter based on surface acoustic waves, in which there are disposed adjacent to one another on a piezoelectric substrate (1) a plurality of one-port resonator structures (2; 3), which comprise two strip reflectors (22 and 23; 32 and 33) and an interdigital transducer (21; 31), wherein the strip reflectors enclose a plane cavity and their reflector strips (221; 231; 321; 331) are shorted by short-circuit strips (222; 223; 232; 233; 322; 332), while the interdigital transducer is disposed in the plane cavity, the strip zones of the strip reflectors (22; 23; 32; 33) and the finger zones of the interdigital transducers (21; 31) in each one-port resonator structure (2; 3) forming, together with the short-circuit strips (222; 223; 232; 233; 322; 332) and with the collector electrodes (212; 213; 312) respectively, waveguides for surface acoustic waves, and the one-port resonator structures (2; 3) being coupled with one another by virtue of the waveguide effect, characterized in that at least one of the one-port resonator structures (2; 3) differs from the other one-port resonator structures by the ratio of the finger width to the spacing (216) of the finger centers (214; 215) and by the ratio of the width of the reflector strips (221; 231; 321; 331) to the spacing (226; 236) of the centers (224; 225 and 234; 235) of the reflector strips (221; 231; 321; 331).

2. A resonator filter according to claim 1, characterized in that the transducers (21; 31) and strip reflectors (22; 23; 32; 33) of neighboring one-port resonator structures (2; 3) form common collector electrodes (213) and short-circuit strips (223; 233) respectively.

3. A resonator filter according to claim 1, characterized in that those one-port resonator structures (2; 3) which differ from the other one-port resonator structures by the ratio of the finger width to the spacing (216) of the finger centers (214; 215) and of the width of the reflector strips (221; 231; 321; 331) to the spacing (226; 236) of the centers (224; 225 and 234; 235) of the reflector strips (221; 231; 321; 331) also differ from one another by the spacing (216) of the finger centers (214; 215) and by the spacing (226; 236) of the centers (224; 225 and 234; 235) of the reflector strips (221; 231; 321; 331).

4. A resonator filter according to claim 1, characterized in that the spacing (216) of the finger centers (214; 215) and the spacing (226; 236) of the centers (224; 225 and 234; 235) of the reflector strips (221; 231; 321; 331) are the same in all one-port resonator structures (2; 3).

5. A resonator filter according to claim 1, characterized in that the number of one-port resonator structures (2; 3) is equal to two.

6. A resonator filter according to claim 5, characterized in that the apertures of the transducers (21; 31) and reflectors (22; 23; 32; 33) in the two one-port resonator structures (2; 3) are the same.

7. A resonator filter according to claim 5, characterized in that the apertures of the transducers (21; 31) and reflectors (22; 23; 32; 33) in the two one-port resonator structures (2; 3) are different.

8. A resonator filter according to claim 1, characterized in that the number of one-port resonator structures (2; 3) is greater than two.

9. A resonator filter according to claim 8, characterized in that the one-port resonator structures (2; 3) form two groups, wherein all transducers within one group are connected to one another in parallel, one group representing the input transducers and the respective other group representing the output transducers.

10. A resonator filter according to claim 1, characterized in that gaps filled with reflector strips maintained at the same potential are present between neighboring one-port resonator structures (2; 3).

11. A resonator filter according to claim 1, characterized in that the transducers (21; 31) in at least one of the one-port resonator structures (2; 3) differ from the other transducers by the finger polarity.

12. A resonator filter according to claim 1, characterized in that two identical filters form a filter cascade, in which the same group is used as the coupling transducer in both filters, the coupling transducer being regarded as that group which is connected to a group of the respective other filter.

13. A resonator filter according to claim 12, characterized in that the group that forms the coupling transducer comprises one-port resonator structures (2; 3) with the same finger and reflector-strip width as well as the same gaps between them.

14. A resonator filter according to claim 13, characterized in that the ratio of the finger width to the spacing (216) of the finger centers (214; 215) and of the width of the reflector strips (221; 231; 321; 331) to the spacing (226; 236) of the centers (224; 225 and 234; 235) of the reflector strips (221; 231; 321; 331) in the group forming the coupling transducer is larger than in all other one-port resonator structures (2; 3).

15. A resonator filter according to claim 13, characterized in that the ratio of the finger width to the spacing (216) of the finger centers (214; 215) and of the width of the reflector strips (221; 231; 321; 331) to the spacing (226; 236) of the centers (224; 225 and 234; 235) of the reflector strips (221; 231; 321; 331) in the group forming the coupling transducer is smaller than in all other one-port resonator structures (2; 3).

* * * * *